United States Patent [19]
Miyashita

[11] Patent Number: 5,903,175
[45] Date of Patent: May 11, 1999

[54] D-TYPE LATCH CIRCUIT AND DEVICE USING THE SAME

[75] Inventor: Takumi Miyashita, Kawasaki, Japan

[73] Assignee: Fujitsu Limited, Kanagawa, Japan

[21] Appl. No.: 08/970,087

[22] Filed: Nov. 13, 1997

Related U.S. Application Data

[63] Continuation of application No. 08/696,528, Aug. 14, 1996, abandoned.

[30] Foreign Application Priority Data

Feb. 26, 1996 [JP] Japan ................................. 8-037005

[51] Int. Cl.[6] .................................................. H03K 3/286
[52] U.S. Cl. ......................... 327/218; 327/219; 327/202; 327/199; 327/208
[58] Field of Search ..................................... 327/199, 200, 327/202, 203, 208, 218, 219, 223, 227, 229, 230, 215, 210, 201, 211, 212, 214, 222, 64, 65, 67, 97, 563

[56] References Cited

U.S. PATENT DOCUMENTS

| 3,777,185 | 12/1973 | Schneider | 327/222 |
| 4,970,406 | 11/1990 | Fitzpatrick et al. | 307/272 |
| 5,510,734 | 4/1996 | Sone | 324/65 |

FOREIGN PATENT DOCUMENTS

| 0379443 | 1/1990 | European Pat. Off. | H03K 3/037 |
| 5218815 | 8/1993 | Japan | H03K 3/286 |

OTHER PUBLICATIONS

IBM Technical Disclosure Bulletin, "Accurate Biasing of Bipolar Differential Amplifiers with CMOS Feedback Circuitry", vol. 38, No. 08, pp. 1–2, Aug. 1995.

Primary Examiner—Timothy P. Callahan
Assistant Examiner—Eunja Shin
Attorney, Agent, or Firm—Nikaido Marmelstein Murray & Oram, LLP

[57] ABSTRACT

A D-type latch circuit includes a first differential amplifier circuit which receives first and second input signals having a complementary relationship and has an active state in a transfer operation and an inactive state in a latch operation. A second differential amplifier circuit receives first and second output signals having the complementary relationship and has an inactive state in the transfer operation and an active state in the latch operation. An output circuit receives output signals of the first differential amplifier circuit and outputs them as the first and second output signals in the transfer operation and receives output signals of the second differential amplifier circuit and outputs them as the first and second output signals in the latch operation. A negative feedback circuit feeds the first and second output signals back to predetermined nodes of the D-type latch circuit.

13 Claims, 8 Drawing Sheets

D-TYPE LATCH CIRCUIT AND DEVICE USING THE SAME

This application is a continuation of application Ser. No. 08/696,528, filed on Aug. 14, 1996, now abandoned.

BACKGROUND OF THE INVENTION

1. Field of the Invention

The present invention relates to D-type latch circuits, and more particularly to a D-type latch circuit suitably adapted to a decision circuit of a receive part in an optical fiber communication system or a comparator of a high-speed A/D (analog-to-digital) converter.

2. Description of the Related Art

FIG. 1 is a circuit diagram of a conventional D-type latch circuit, which includes differential amplifier circuits 1 and 2. The differential amplifier circuit 1 includes enhancement-type MES FETs 3 and 4, which perform a differential amplifying operation on complementary input signals IN and /IN. The term "MES FET" is an abbreviation of metal-semiconductor field effect transistor. The differential amplifier circuit 2 includes enhancement-type MES FETs 5 and 6, which perform a differential amplifying operation on complementary output signals OUT and /OUT.

A resistor 7 is a load of the MES FETs 3 and 5, and a resistor 8 is a load of the MES FETs 4 and 6. The differential amplifier circuit 1 includes an enhancement-type MES FET 9, which conducts (ON) and non-conducts (OFF) according to a transfer signal TR. The differential amplifier circuit 2 includes an enhancement-type MES FET 10, which is turned ON and OFF according to a latch signal LT. A depletion-type MES FET 11 functions as a constant-current source of the differential amplifier circuits 1 and 2.

The D-type latch circuit shown in FIG. 1 further includes an output circuit 12 including a source-follower circuit. The output circuit 12 includes enhancement-type MES FETs 13 and 14 serving as output transistors, and depletion-type MES FETs 15 and 16 serving as constant-current sources.

FIG. 2 is a waveform diagram of an operation of the D-type latch circuit shown in FIG. 1, and more particularly shows waveforms of the input signals IN, /IN, the output signals OUT and /OUT, the transfer signal TR and the latch signal LT.

When the transfer signal TR is at a high level (H) and the latch signal LT is at a low level (L), the MES FET 9 is ON and the MES FET 10 is OFF. Further, the differential amplifier circuit 1 is in an active state, and the differential amplifier circuit 2 is in an inactive state. Hence, the D-type latch circuit performs a transfer operation on the input signals IN and /IN by the differential amplifier circuit 1 and the output circuit 12.

In the above case, when the input signals IN and /IN are respectively at the low and high levels, the MES FETs 3 and 4 are respectively OFF and ON. Further, the levels of nodes 17 and 18 shown in FIG. 1 are respectively high and low, and the MES FETs 13 and 14 are respectively OFF and ON. Hence, the output signals OUT and /OUT are respectively at the low and high levels.

In the above state, when the transfer signal TR switches to the low level and the latch signal LT switches to the high level, the MES FETs 9 and 10 are respectively turned OFF and ON, and the differential amplifier circuits 1 and 2 are switched to the inactive and active states, respectively. Hence, the D-type latch circuit performs a latch operation on the input signals IN and /IN by the output circuit 12 and the differential amplifier circuit 2.

The input signals IN and /IN are transferred to the differential amplifier circuit 2 via the output circuit 12 from the differential amplifier circuit 1. Hence, when the states of the input signals IN and /IN change, the output signals OUT and /OUT are changed with a delay time $t_{SU}$-A caused by the differential amplifier circuit 1, the output circuit 12 and the differential amplifier circuit 2. Hence, in order to latch the transitions of the states of the input signals IN and /IN in the D-type latch circuit, it is necessary to fall the transfer signal TR and rise the latch signal LT when the delay time $t_{SU}$-A elapses after the transitions of the states of the input signals.

In other words, it is not possible to latch the transitions of the input signals IN and /IN unless the delay time $t_{SU}$-A elapses from the transitions of the input signals IN and /IN. The above fact prevents applications of the D-type latch circuit to high-speed circuits, such as a decision circuit in a receive part in an optical fiber communication system and a comparator in an A/D converters. The decision circuit determines whether the received signal is "1" or "0".

Further, the D-type latch circuit shown in FIG. 1 is greatly affected by deviations of the threshold voltages of the transistors used therein caused by factors in the production process. In other words, the D-type latch circuit does not have any means for reducing the influence of the deviations of the threshold voltages of the transistors.

SUMMARY OF THE INVENTION

It is a general object of the present invention to provide a D-type latch circuit in which the above disadvantages are eliminated.

A more specific object of the present invention is to provide a higher-speed D-type latch circuit with a reduced delay time between the transitions of the input and output signals, in which deviations of the threshold voltages of transistors used therein can be sufficiently compensated for.

The above objects of the present invention are achieved by a D-type latch circuit comprising:

a first differential amplifier circuit which receives first and second input signals having a complementary relationship and has an active state in a transfer operation and an inactive state in a latch operation;

a second differential amplifier circuit which receives first and second output signals having the complementary relationship and has an inactive state in the transfer operation and an active state in the latch operation;

an output circuit which receives output signals of the first differential amplifier circuit and outputs them as the first and second output signals in the transfer operation and receives output signals of the second differential amplifier circuit and outputs them as the first and second output signals in the latch operation; and a negative feedback circuit which feeds the first and second output signals back to predetermined nodes of the D-type latch circuit.

The above D-type latch circuit may be configured so that the negative feedback circuit comprises a circuit which cause the first and second output signals to be fed back to the output circuit only in transfer operation.

The D-type latch circuit may be configured so that the negative feedback circuit comprises first and second transistors respectively having control terminals receiving the first and second output signals, first terminals respectively connected to input terminals of the output circuit, and second terminals coupled to a constant-current source.

The D-type latch circuit may be configured so that the negative feedback circuit comprises a third transistor having a control terminal receiving a control signal controlling the transfer operation, a first terminal connected to the second terminals of the first and second transistors, and a second terminal connected to the constant-current source.

The D-type latch circuit may be configured so that the negative feedback circuit comprises first and second resistors connected between input terminals of the first differential amplifier and output terminals of the output circuit.

The D-type latch circuit may be configured so that wherein the negative feedback circuit comprises third and fourth resistors via which the first and second input signals are applied to the input terminals of the first differential amplifier.

The D-type latch circuit may further comprise another feedback circuit which controls currents flowing in the first and second differential amplifier circuits on the basis of the firs and second output signals.

Another object of the present invention is to provide a device using the above D-type latch circuit.

This object of the present invention is achieved by a device comprising:

a first circuit performing a first predetermined circuit operation on an input signal; and a second circuit performing a second predetermined circuit operation on an output signal of the first circuit, the first circuit comprising D-type latch circuits cascaded, each of the D-type latch circuits comprising:

a first differential amplifier circuit which receives first and second input signals having a complementary relationship and has an active state in a transfer operation and an inactive state in a latch operation;

a second differential amplifier circuit which receives first and second output signals having the complementary relationship and has an inactive state in the transfer operation and an active state in the latch operation;

an output circuit which receives output signals of the first differential amplifier circuit and outputs them as the first and second output signals in the transfer operation and receives output signals of the second differential amplifier circuit and outputs them as the first and second output signals in the latch operation; and a negative feedback circuit which feeds the first and second output signals back to predetermined nodes of the D-type latch circuit.

The above device may be configured so that the device is a receive part of an optical fiber communication system, and the second circuit includes a decision circuit of the receive part.

The device may also be configured so that the device is an analog-to-digital converter, and the second circuit includes a comparator of the analog-to-digital converter.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
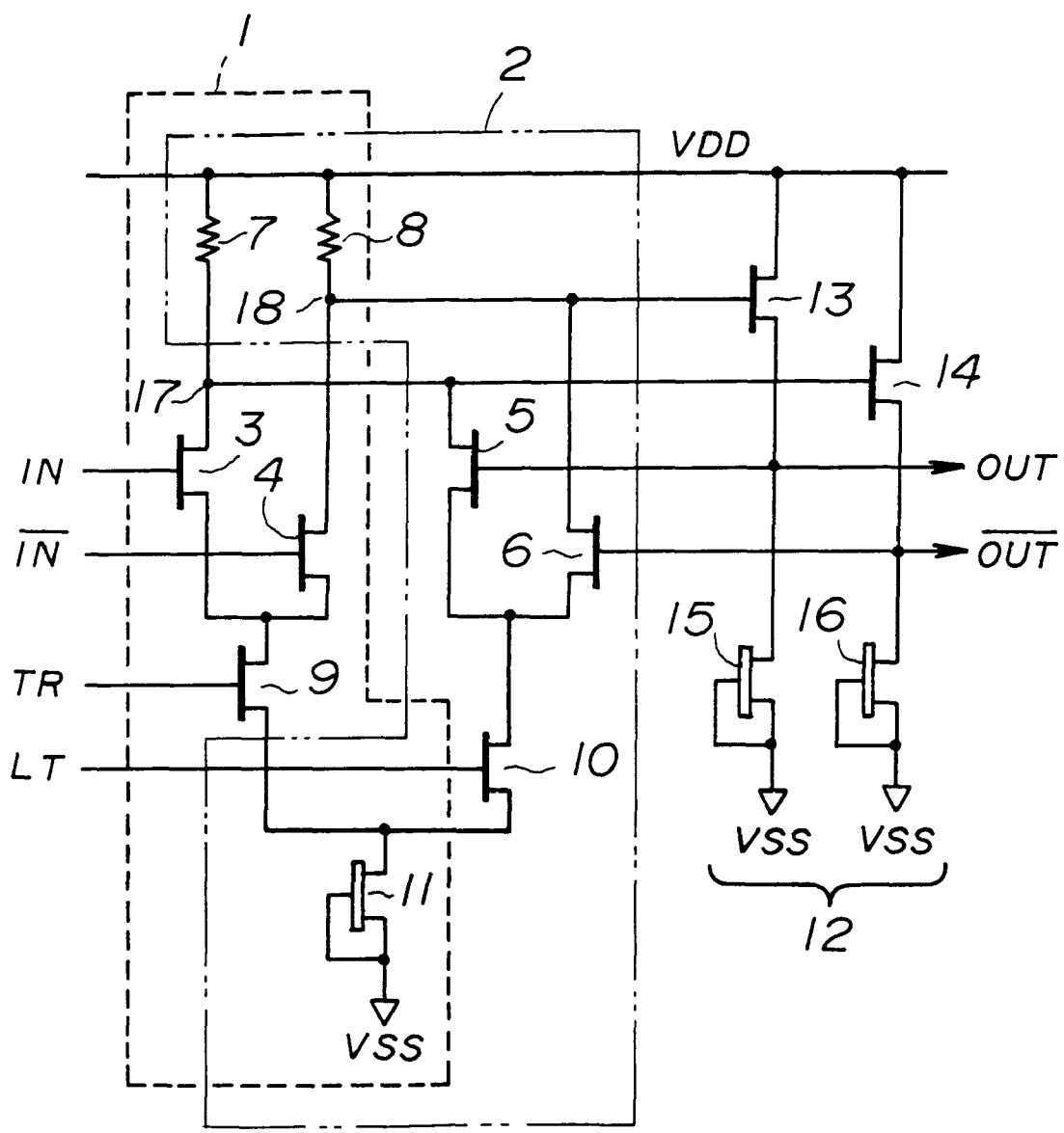
FIG. 1 is a circuit diagram of a conventional D-type latch circuit.
Figure 2:
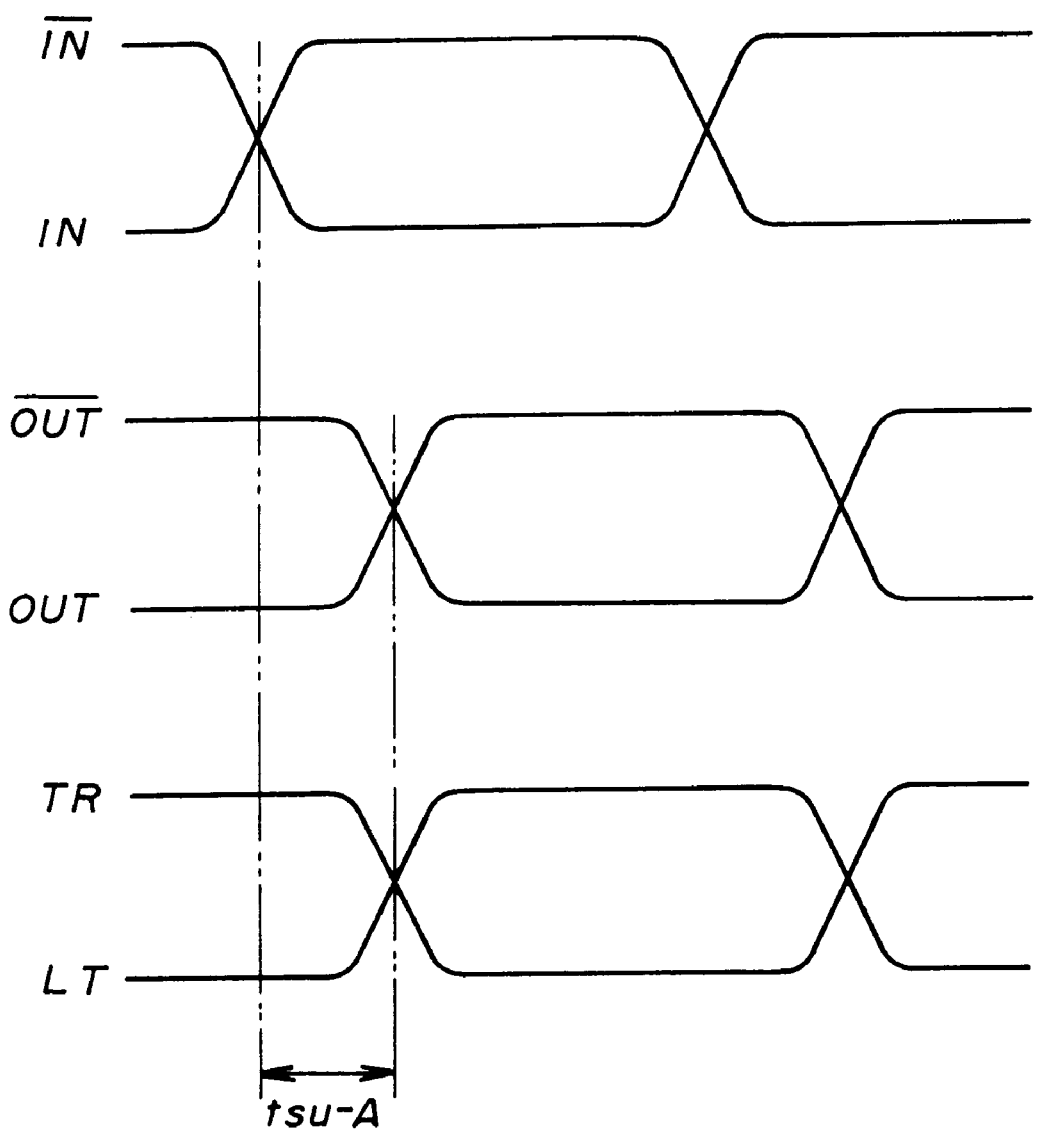
FIG. 2 is a waveform diagram of an operation of the D-type latch circuit shown in FIG. 1.
Figure 3:
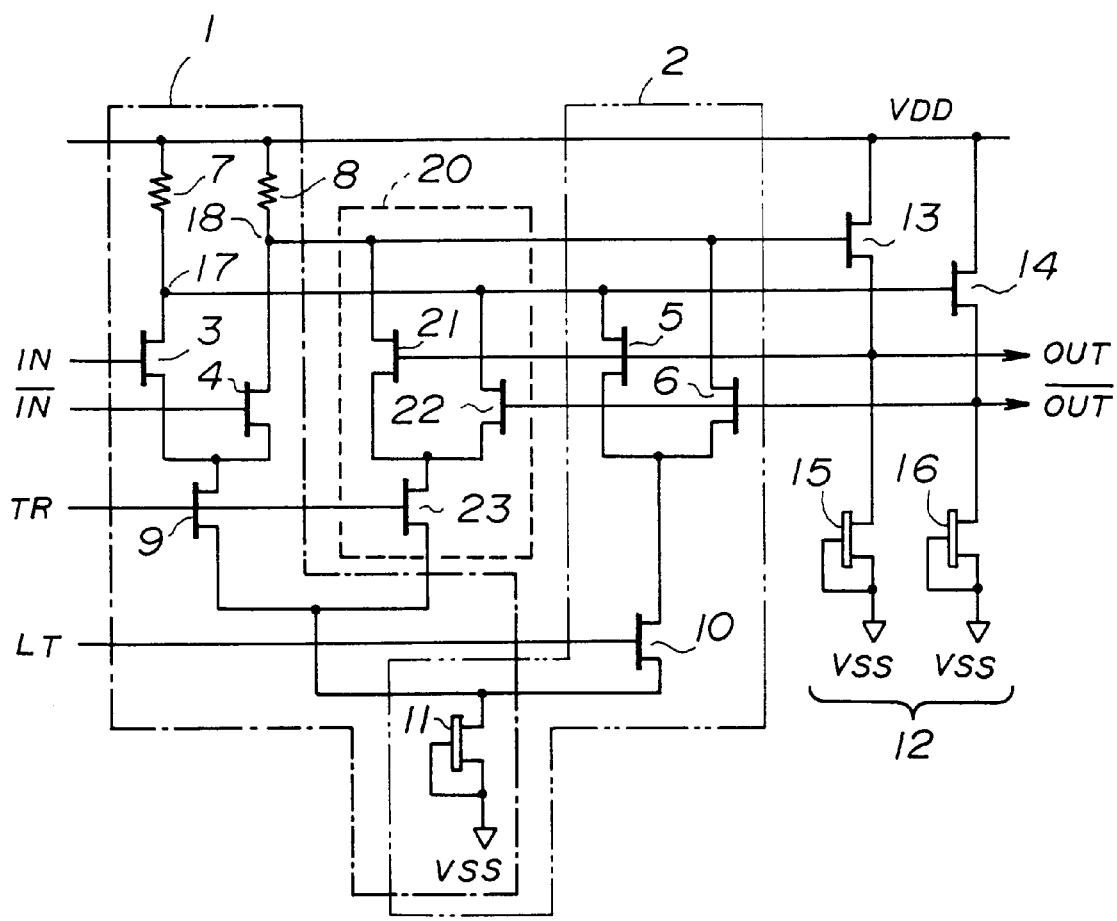
FIG. 3 is a circuit diagram of a D-type latch circuit according to a first embodiment of the present invention.

FIG. 3 is a circuit diagram of a D-type latch circuit according to a first embodiment of the present invention. In FIG. 3, parts that are the same as those shown in FIG. 1 are given the same reference numbers. The D-type latch circuit includes a negative feedback circuit 20, which feeds the output signals OUT and /OUT output from the output circuit 12 at the time of the transfer operation back to the output circuit 12.

The negative feedback circuit 20 includes enhancement-type MES FETs 21, 22 and 23. The gate of the MES FET 21 is supplied with the output signal OUT, and the drain thereof is connected to the gate of the MES FET 13. The gate of the MES FET 22 is supplied with the output signal /OUT, and the drain thereof is connected to the gate of the MES FET 14. The source of the MES FET 22 is connected to the source of the MES FET 21. The MES FET 23 is turned ON and OFF in response to the transfer signal TR. The drain of the MES FET 23 is connected to a node at which the sources of the MES FETs 21 and 22 are connected together. The source of the MES FET 23 is connected to the drain of the MES FET 11. The D-type latch circuit operates with power supply voltages VDD and VSS.

Figure 4:
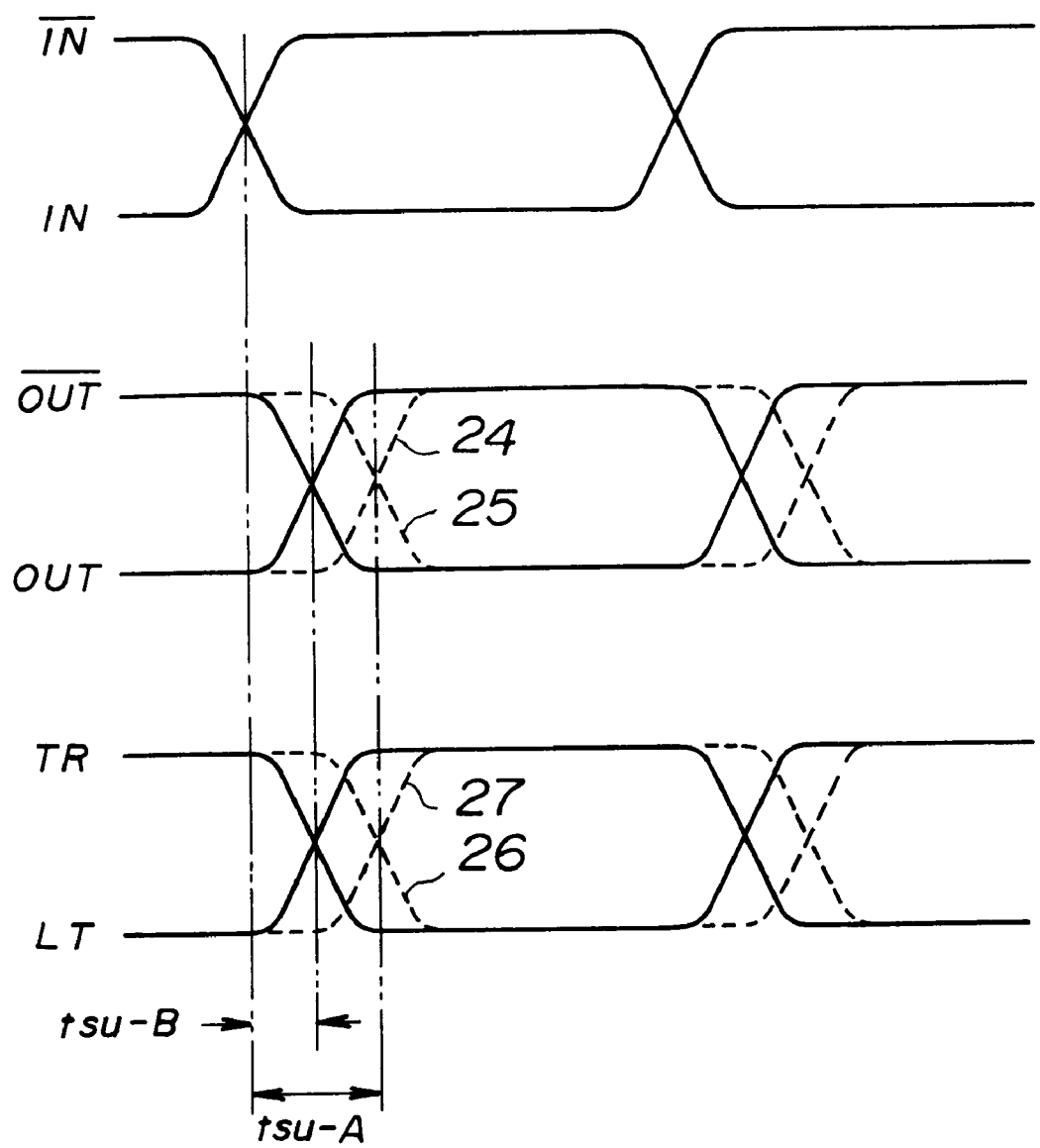
FIG. 4 is a waveform diagram of an operation of the D-type latch circuit shown in FIG. 3.

FIG. 4 is a waveform diagram of an operation of the D-type latch circuit shown in FIG. 3, and more particularly shows waveforms of the input signals IN, /IN, the output signals OUT, /OUT, the transfer signal TR and the latch signal LT.

When the transfer signal TR is at the high level and the latch signal LT is at the low level, the MES FETs 9 and 10 are respectively ON and OFF, and the differential amplifier circuits 1 and 2 are respectively in the active and inactive states. Hence, the D-type latch circuit performs the transfer operation on the input signals IN and /IN by the differential amplifier circuit 1 and the output circuit 12.

In the above case, when the input signals IN and /IN are respectively at the low and high levels, the MES FETs 3 and 4 are respectively OFF and ON, and the levels of the nodes 17 and 18 are respectively high and low. Further, the MES FETs 13 and 14 are respectively OFF and ON, and the output signals OUT and /OUT are respectively at the low and high levels. Further, in the above case, the MES FET 23 is ON and the negative feedback circuit 20 is in the active state. Hence, the negative feedback circuit 20 feeds the output signals OUT and /OUT from the output circuit 12 back thereto.

In the above state, when the transfer signals TR switches to the low level and the latch signal LT switches to the high level, the MES FETs 9 and 10 are respectively turned OFF and ON, and the differential amplifier circuits 1 and 2 are respectively switched to the inactive and active states. Hence, the D-type latch circuit performs the latch operation on the input signals IN and /IN by the output circuit 12 and the differential amplifier circuit 2.

In the above case, the MES FET 23 is OFF and the negative feedback circuit 20 is in the inactive state. Hence, the negative feedback circuit 20 steps feeding the output signals OUT and /OUT output from the output circuit 12 back thereto.

The input signals IN and /IN are transferred to the differential amplifier circuit 2 via the output circuit 12 from the differential amplifier circuit 1. Hence, when the states of the input signals IN and /IN change, the states of the output signals OUT and /OUT change with a certain delay time. According to the first embodiment of the present invention, the output signals OUT and /OUT are fed back to the output circuit 12 by the negative feedback circuit 20 at the time of the transfer operation. Thus, the output signals OUT and /OUT can be changed with a reduced delay time $t_{SU}$-B that is shorter than the aforementioned delay time $t_{SU}$-A.

In FIG. 4, broken lines 24, 25, 26 and 27 respectively show the output signals OUT and /OUT, the transfer signal TR and the latch signal LT observed in the conventional D-type latch circuit.

According to the first embodiment of the present invention, in order to latch the transitions of the input signals IN and /IN, it is possible to fall the transfer signal TR and rise the latch signal LT when the delay time $t_{SU}$-B elapses after the transitions of the input signals IN and /IN. Hence, it is possible to speed up the latch operation.

The negative feedback operation on the output signals OUT and /OUT is carried out at the time of only the transfer operation. Hence, it is possible to obtain the output signals OUT and /OUT having a sufficient amplitude at the time of the latch operation and to compensate for the deviations of the threshold levels of the input transistors caused due to factors in the production process.

Figure 5:
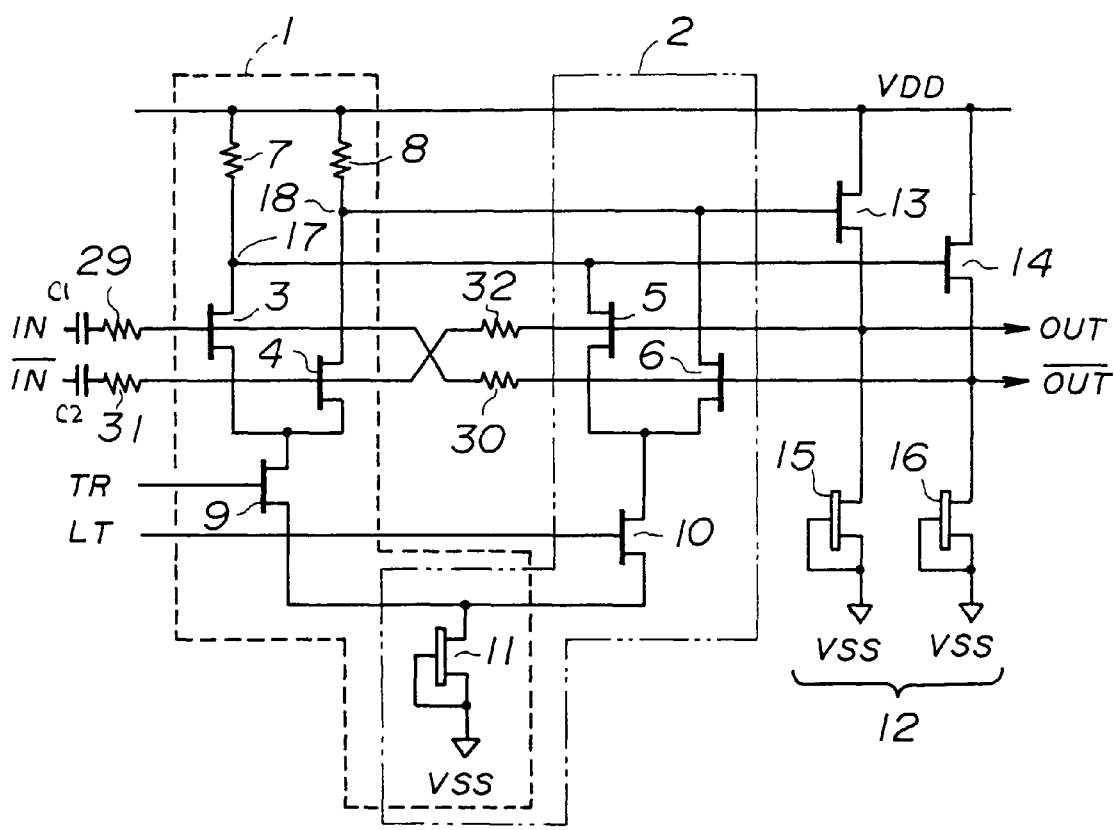
FIG. 5 is a circuit diagram of a D-type latch circuit according to a second embodiment of the present invention.

FIG. 5 is a circuit diagram of a D-type latch circuit according to a second embodiment of the present invention. In FIG. 5, parts that are the same as those shown in the previously described figures are given the same reference numbers. The D-type latch circuit shown in FIG. 5 has a negative feedback circuit which is made up of resistors 29–32 and performs a negative feedback operation in which the output signals OUT and /OUT from the output circuit 12 are fed back thereto at the time of the transfer operation on the input signals IN and /IN, which are applied through capacitors C1 and C2. The other circuit configuration is the same as that of the D-type latch circuit shown in FIG. 3.

In operation, when the transfer signal TR is at the high level and the latch signal LT is at the low level, the MES FETs 9 and 10 are ON and OFF, respectively, and the differential amplifier circuits 1 and 2 are in the active and inactive states, respectively. In this state, the D-latch circuit performs the transfer operation on the input signals IN and /IN by the differential amplifier 1 and the output circuit 12. Further, the output signals OUT and /OUT are fed back to the differential amplifier circuit 1 due to the function of the negative feedback circuit made up of the resistors 29–32.

In the above state, when the transfer signal TR switches to the low level and the latch signal LT switches to the high level, the MES FETs 9 and 10 are respectively turned OFF and ON, and the differential amplifier circuits 1 and 2 are respectively switched to the inactive and active states. Hence, the D-type latch circuit performs the latch operation on the input signals IN and /IN by the output circuit 12 and the differential amplifier circuit 2. In this case, the differential amplifier circuit 1 is in the inactive state, and thus the negative feedback operation on the output signals OUT and /OUT is not carried out.

The input signals IN and /IN are transferred to the differential amplifier circuit 2 from the differential amplifier circuit 1 via the output circuit 12. Hence, when the states of the input signals IN and /IN change, the output signals OUT and /OUT are changed with a given delay time. At the time of the transfer operation, the output signals OUT and /OUT are fed back to the differential amplifier circuit 1 by the negative feedback circuit made up of the resistors 29–32. Hence, the change of the states of the output signals OUT and /OUT is completed with a shorter delay time than the conventional delay time $t_{SU-A}$-A.

Thus, it is possible to latch the changes of the states of the input signals IN and /IN by falling the transfer signal TR and rising the latch signal LT when a time shorter than the delay time $t_{SU}$-A elapses after the changes of the states of the input signals IN and /IN occur. As a result, it is possible to speed up the latch operation.

Further, since the output signals OUT and /OUT are fed back to the differential amplifier circuit 1 at the time of only the transfer operation, it is possible to obtain the output signals OUT and /OUT having a sufficient amplitude at the time of the latch operation and to compensate for the deviations of the threshold levels of the input transistors caused due to factors in the production process.

Figure 6:
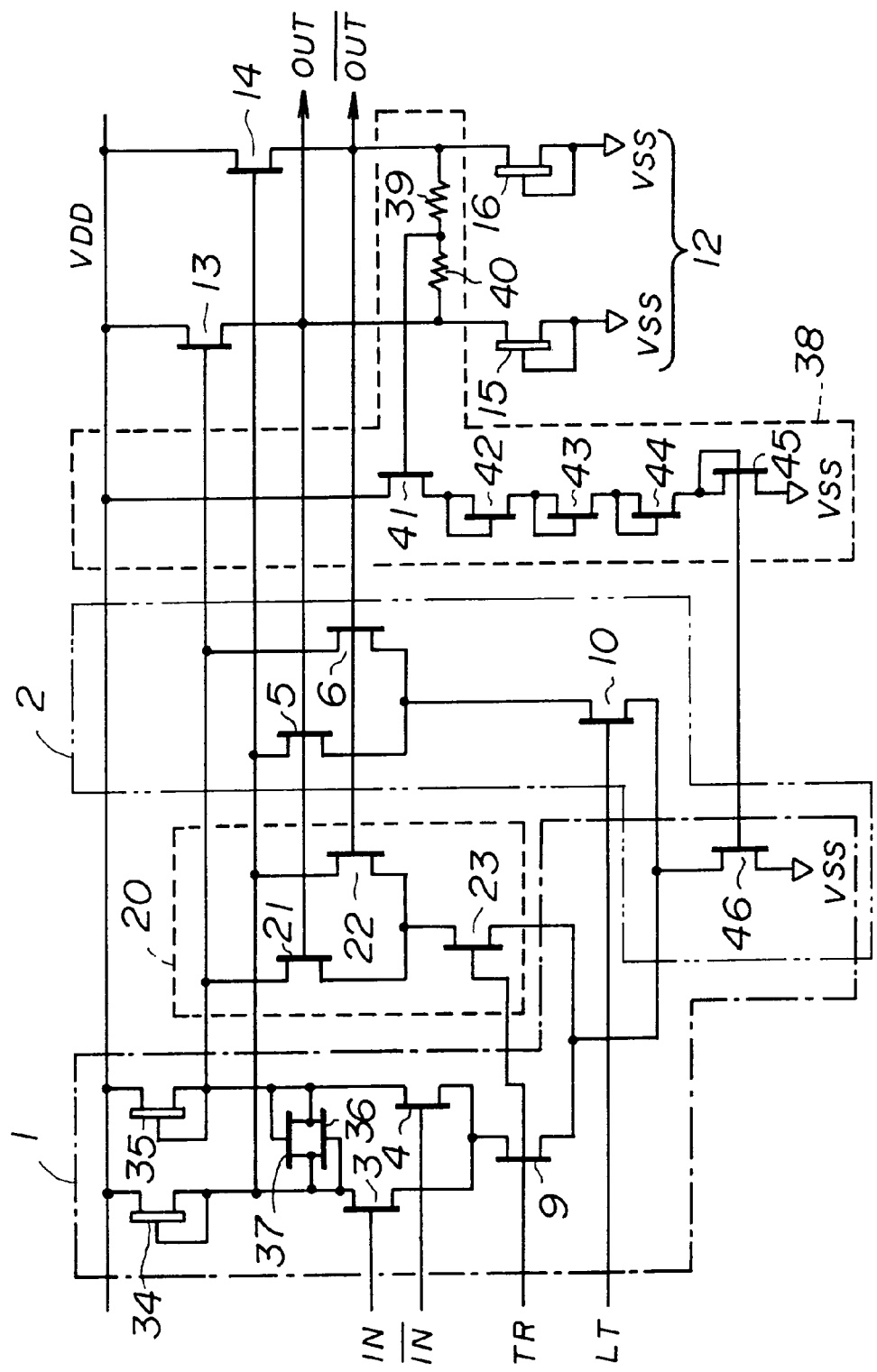
FIG. 6 is a circuit diagram of a D-type latch circuit according to a third embodiment of the present invention.

FIG. 6 is a circuit diagram of a D-type latch circuit according to a third embodiment of the present invention. In FIG. 6, parts that are the same as those shown in the previously described figures are given the same reference numbers. In the D-type latch circuit shown in FIG. 6, depletion-type MES FETs 34 and 35 are substituted for the load resistors 7 and 8 shown in FIG. 3.

Further, the differential amplifier circuit 1 shown in FIG. 6 is equipped with a clip circuit, which functions to limit the amplitudes of the output signals of the differential amplifier circuit 1 and is made up of enhancement-type MES FETs 36 and 37.

Furthermore, the D-type latch circuit shown in FIG. 6 is equipped with a common-mode feedback circuit 38, which functions to control the operating point to an optimal point and is made up of resistors 39 and 40 and enhance-type MES FETs 41–45.

Moreover, instead of the depletion-type MES FET 11, there is provided an enhancement-type MES FET 46, which cooperates with the MES FET 45 to configure a current-mirror circuit. The other circuit configuration is the same as the circuit configuration shown in FIG. 3.

In operation, when the transfer signal TR is at the high level and the latch signal LT is at the low level, the MES FETs 9 and 10 are respectively ON and OFF, and the differential amplifier circuits 1 and 2 are respectively in the active and inactive states. Hence, the D-type latch circuit performs the transfer operation IN and /IN by the differential amplifier circuit 1 and the output circuit 12. In this case, the MES FET 23 is ON and the negative feedback circuit 20 is in the active state. Hence, the negative feedback circuit 20 feeds the output signals OUT and /OUT from the output circuit 12 thereto.

In the above state, when the transfer signal TR is switched to the low level and the latch signal LT is switched to the high level, the MES FETs 9 and 10 are switched to OFF and ON, and the differential amplifier circuits 1 and 2 are respectively switched to the inactive and active states. Hence, the D-type latch circuit performs the latch operation on the input signals IN and /IN by the output circuit 12 and the differential amplifier circuit 2, so that the input signals IN and /IN are latched. In this case, the MES FET 23 is OFF and the negative feedback circuit 20 is in the inactive state. Hence, the negative feedback operation on the output signals OUT and /OUT from the output circuit 12 thereto is stopped.

The input signals IN and /IN are transferred to the differential amplifier circuit 2 from the differential amplifier circuit 1 via the output circuit 12. Hence, when the states of the input signals IN and /IN change, the output signals OUT and /OUT are changed with a given delay time. At the time of the transfer operation, the output signals OUT and /OUT are fed back to the differential amplifier circuit 1 by the negative feedback circuit made up of the resistors 29–32. Hence, the change of the states of the output signals OUT and /OUT is completed with a shorter delay time than the conventional delay time $t_{SU-A}$-A.

Thus, it is possible to latch the changes of the states of the input signals IN and /IN by falling the transfer signal TR and rising the latch signal LT when a time shorter than the delay time $t_{SU}$-A elapses after the changes of the states of the input signals IN and /IN occur. As a result, it is possible to speed up the latch operation.

Further, since the output signals OUT and /OUT are fed back to the differential amplifier circuit 1 at the time of only the transfer operation, it is possible to obtain the output signals OUT and /OUT having a sufficient amplitude at the time of the latch operation and to compensate for the deviations of the threshold levels of the input transistors caused due to factors in the production process.

The different between the output signals OUT and /OUT is divided by the resistors 39 and 40, and a resultant voltage is applied to the gate of the MES FET 41. A current based on the gate voltage of the MES FET 41 flows in the MES FETs 41–45 from the power supply line VDD, and determines the value of the gate voltage of the MES FET 45. The above gate voltage is also the gate voltage of the MES FET 46 functioning as a constant-current source. Hence, the value of the constant current is adjusted based on the potential of the connection node of the resistors 39 and 40, that is, the level of the center (common) point of the amplitudes of the output signals OUT and /OUT. In the above manner, the center point of the amplitudes of the output signals OUT and /OUT can be adjusted.

Figure 7:
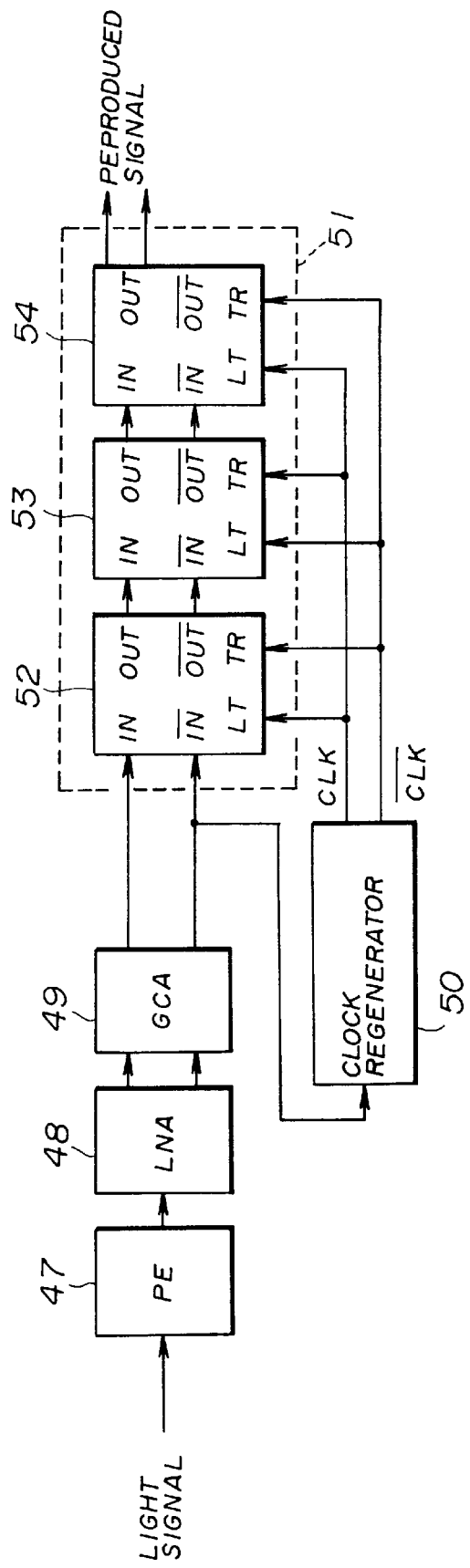
FIG. 7 is a block diagram of a receive part of an optical fiber communication system to which D-type latch circuits are applied.

FIG. 7 is a block diagram of a receive part of an optical fiber communication system to which one of the above-mentioned D-type latch circuits is applied. The optical fiber communication system includes a photo-electric conversion circuit (PE) 47, a low-noise amplifier (LNA) 48, a gain control amplifier (GCA) 49, a clock regenerator 50, and a decision circuit 51. It will be noted that a communication device or an LSI device can be configured by using all or some of the components 47–51.

The decision circuit 51 includes D-type latch circuits 52, 53 and 54 which are cascaded in order to obtain a given gain. For example, each of the D-type latch circuits 52, 53 and 54 has the circuit configuration shown in FIG. 6. Hence, the decision circuit 51 operates at a high speed in a stable state. Each of the D-type latch circuits 52–54 is equipped with the common-mode feedback circuit 38, and the center point of the amplitudes of the output signals OUT and /OUT can be precisely regulated. Hence, it is possible to reduce a hysteresis (driving power needed at the time of latching the logical value opposite to the logical value latched in the previous operation cycle). This contributes to speeding up high-speed data transfer.

Figure 8:
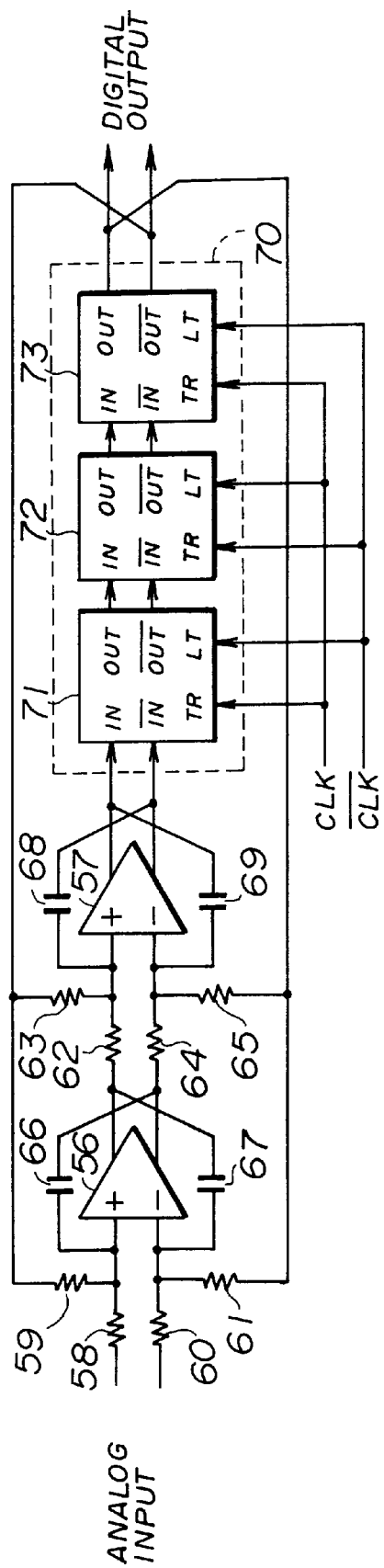
FIG. 8 is a block diagram of an A/D converter to which D-type latch circuits are applied.

FIG. 8 is a block diagram of a sigma-delta type A/D converter to which one of the above-mentioned D-type latch circuits is applied. The A/D converter shown in FIG. 8 includes differential amplifiers 56 and 57, resistors 58–65, capacitors 66–69, and a comparator 70. The comparator 70 includes D-type latch circuits 71, 72 and 73 which are cascaded in order to obtain a given gain. For example, each of the D-type latch circuits 71, 72 and 73 has the circuit configuration shown in FIG. 6. Hence, the decision circuit 51 operates at a high speed in a stable state. This leads to speeding up of the A/D conversion operation. Each of the D-type latch circuits 52–54 is equipped with the common-mode feedback circuit 38, and thus a reduced hysteresis can be obtained.

In the previously described configurations, MES FETs are used. However, it is possible to use other types of transistors such as HEMTs (high electron mobility transistors), bipolar transistors, HBT (hot electron bipolar transistors) or MOS (metal oxide semiconductor) transistors.

According to the present invention, the D-latch circuit is equipped with the negative feedback circuit which feeds the output signals from the output circuit back to the output circuit or the first differential amplifier circuit. Hence, it is possible to reduce the delay time between the transitions of the input signals and the resultant transitions of the output signals and to thus latch the input signals with a reduced delay time. Further, the negative feedback operation compensates for deviations of the threshold values of the transistors and thus enables the stable circuit operation.

The present invention is not limited to the specifically disclosed embodiments, and variations and modifications may be made without departing from the scope of the present invention.

What is claimed is:

1. A D-type latch circuit comprising:
   a first differential amplifier circuit which receives, at first and second input terminals, first and second input signals having a complementary relationship and has an active state when a transfer signal is a given level and an inactive state when a latch signal is a same given level as the transfer signal;
   a second differential amplifier circuit which receives first and second output signals having the complementary relationship and has an inactive state when the transfer signal is the given level and an active state when the latch signal is the same given level as the transfer signal;
   an output circuit having first and second output terminals and first and second input terminals, the output circuit receives, at the first and second input terminals, output signals of the first differential amplifier circuit and outputs them, at the first and second output terminals thereof, as the first and second output signals when the transfer signal is the given level and the output circuit receives, at the first and second input terminals, output signals of the second differential amplifier circuit and outputs them, at the first and second output terminals, as the first and second output signals when the latch signal is the same given level as the transfer signal; and
   a negative feedback circuit connected to the first and second output terminals of the output circuit and connected to the first and second input terminals of the output circuit, said negative feedback circuit feeds the first and second output signals back to the first and second input terminals of the output circuit of the D-type latch circuit.

2. The D-type latch circuit as claimed in claim 1, wherein the negative feedback circuit comprises a circuit which cause the first and second output signals to be fed back to the output circuit only when the transfer signal is the given level.

3. The D-type latch circuit as claimed in claim 1, wherein the negative feedback circuit comprises first and second transistors respectively having a) control terminals receiving the first and second output signals, b) first terminals respectively connected to the input terminals of the output circuit, and c) second terminals coupled to a constant-current source.

4. The D-type latch circuit as claimed in claim 3, wherein the negative feedback circuit comprises a third transistor having a) a control terminal receiving a control signal as the transfer signal, b) a first terminal connected to the second terminals of the first and second transistors, and c) a second terminal connected to the constant-current source.

5. A D-type latch circuit comprising:

a first differential amplifier circuit which receives, at first and second input terminals, first and second input signals having a complementary relationship and has an active state when a transfer signal is a given level and an inactive state when a latch signal is a same given level as the transfer signal:

a second differential amplifier circuit which receives first and second output signals having the complementary relationship and has an inactive state when the transfer signal is the given level and an active state when the latch signal is the same given level as the transfer signal:

an output circuit having first and second output terminals and first and second input terminals, the output circuit receives, at the first and second input terminals, output signals of the first differential amplifier circuit and outputs them, at the first and second output terminals thereof, as the first and second output signals when the transfer signal is the given level and the output circuit receives, at the first and second input terminals, output signals of the second differential amplifier circuit and outputs them, at the first and second output terminals, as the first and second output signals when the latch signal is the same given level as the transfer signal; and a negative feedback circuit connected to the first and second output terminals of the output circuit, wherein the negative feedback circuit comprises first and second resistors each connected between one of the input terminals of the first differential amplifier and one of the output terminals of the output circuit.

6. The D-type latch circuit as claimed in claim 5, wherein the negative feedback circuit comprises third and fourth resistors via which the first and second input signals are applied to the input terminals of the first differential amplifier.

7. The D-type latch circuit as claimed in claim 1, further comprising another feedback circuit connected between said first and second output signals and which controls currents flowing in the first and second differential amplifier circuits on the basis of the first and second output signals.

8. A device comprising:

a first circuit performing a first predetermined circuit operation on an input signal; and a second circuit performing a second predetermined circuit operation on an output signal of the first circuit, the second circuit comprising D-type latch circuits cascaded, each of the D-type latch circuits comprising:

a first differential amplifier circuit which receives first and second input signals having a complementary relationship and has an active state when a transfer signal is a given level and an inactive state when a latch signal is a same given level as the transfer signal;

a second differential amplifier circuit which receives first and second output signals having the complementary relationship and has an inactive state when the transfer signal is the given level and an active state when the latch signal is the same given level as the transfer signal;

an output circuit having first and second input terminals and first and second output terminals, the output circuit receives, at the first and second input terminals, output signals of the first differential amplifier circuit and outputs them at the first and second output terminals as the first and second output signals when the transfer signal is the given level and receives, at the first and second input terminals, output signals of the second differential amplifier circuit and outputs them, at the first and second output terminals, as the first and second output signals when the latch signal is the same given level as the transfer signal; and a negative feedback circuit connected to the first and second output terminals of the output circuit and connected to the first and second input terminals of the output circuit, the negative feedback circuit feeds the first and second output signals back to the first and second input terminals of the output circuit of the D-type latch circuit.

9. The device as claimed in claim 8, wherein the device is a receive part of an optical fiber communication system, and the second circuit includes a decision circuit of the receive part.

10. The device as claimed in claim 8, wherein the device is an analog-to-digital converter, and the second circuit includes a comparator of the analog-to-digital converter.

11. The device as claimed in claim 1, wherein said negative feedback circuit feeds back the output signals of the output circuit to the output circuit at the time of a transfer operation wherein a time delay between transitions of the first and second input and output signals is reduced.

12. The device as claimed in claim 8, wherein said negative feedback circuit feeds back the output signals of the output circuit to the output circuit at the time of a transfer operation wherein a time delay between transitions of the first and second input and output signals is reduced.

13. The device as claimed in claim 5, wherein said negative feedback circuit feeds back the output signals of the output circuit to the first differential amplifier at the time of a transfer operation wherein a time delay between transitions of the first and second input and output signals is reduced.

* * * * *